United States Patent
Shen et al.

(10) Patent No.: US 9,780,918 B2
(45) Date of Patent: Oct. 3, 2017

(54) RATE MATCHING METHOD AND APPARATUS FOR POLAR CODES, AND WIRELESS COMMUNICATION DEVICE

(71) Applicant: Huawei Technologies Co., Ltd., Shenzhen (CN)

(72) Inventors: Hui Shen, Shenzhen (CN); Bin Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 10 days.

(21) Appl. No.: 15/146,709

(22) Filed: May 4, 2016

(65) Prior Publication Data

US 2016/0248547 A1    Aug. 25, 2016

Related U.S. Application Data

(63) Continuation of application No. PCT/CN2013/086508, filed on Nov. 4, 2013.

(51) Int. Cl.
*H03M 13/03* (2006.01)
*H04L 1/00* (2006.01)
*H03M 13/13* (2006.01)

(52) U.S. Cl.
CPC .......... *H04L 1/0069* (2013.01); *H03M 13/13* (2013.01); *H04L 1/0041* (2013.01); *H04L 1/0057* (2013.01)

(58) Field of Classification Search
CPC ... H04L 1/0068; H04L 1/0069; H04L 1/0041; H04L 1/0059; H03M 13/13; H03M 13/00; H03M 13/005; H03M 13/6362
See application file for complete search history.

(56) References Cited

U.S. PATENT DOCUMENTS 7,293,217 B2 * 11/2007 Pietraski ........... H03M 13/2957
375/265

8,171,383 B2 * 5/2012 Landau ............. H03M 13/2957
714/781

(Continued)

FOREIGN PATENT DOCUMENTS

CN 101499805 A 8/2009
CN 102113278 A 6/2011

(Continued)

OTHER PUBLICATIONS

Cadambe et al., "Interference Alignment and Spatial Degrees of Freedom for the $K$ User Interference Channel," pp. 971-975, Institute of Electrical and Electronics Engineers, New York, New York (2008).

(Continued)

*Primary Examiner* — Christine Tu
(74) *Attorney, Agent, or Firm* — Leydig, Voit & Mayer, Ltd.

(57) ABSTRACT

A rate matching method for polar codes includes: with respect to polar codes output by an encoder, determining a plurality of types of punching position sets to be selected, punching positions indicated by any two punching position sets being not completely identical to each other; for each type of punching position set, determining the sum of error probabilities of all bit channels for transmitting information bits of the Polar codes when the punching position set is applied, the sum of the error probabilities being called the upper limit of frame error ratios corresponding to the punching position set; and from the plurality of types of punching position sets to be selected, selecting a punching position set corresponding to the minimum upper limit of the frame error ratios as a selected punching position set, and according to p punching positions indicated in the selected punching position set, conducting rate matching,

13 Claims, 6 Drawing Sheets

(56) References Cited

U.S. PATENT DOCUMENTS

| | | | |
|---|---|---|---|
| 9,467,164 B2* | 10/2016 | Ionita | H04L 25/4917 |
| 2010/0067441 A1 | 3/2010 | Kim et al. | |
| 2014/0173376 A1* | 6/2014 | Jeong | H03M 13/2906 |
| | | | 714/755 |

FOREIGN PATENT DOCUMENTS

| | | |
|---|---|---|
| CN | 102292934 A | 12/2011 |
| JP | 2012151909 A | 8/2012 |

OTHER PUBLICATIONS

Mo et al., "Analysis of Puncturing Pattern for High Rate Turbo Codes," pp. 547-550, Institute of Electrical and Electronics Engineers, New York, New York (1999).

Shin et al., "Design of Length-Compatible Polar Codes Based on the Reduction of Polarizing Matrices," IEEE Transaction on Communications, vol. 61, Issue 7, pp. 2593-2599, Institute of Electrical and Electronics Engineers, New York, New York (Jul. 2013).

Chen et al., "A Hybrid ARQ Scheme Based on Polar Codes," IEEE Communications Letters, vol. 17, Issue 10, pp. 1996-1999, Institute of Electrical and Electronics Engineers, New York, New York (Oct. 2013).

Eslami et al., "A Practical Approach to Polar Codes," 2011 IEEE International Symposium on Information Theory Proceedings, pp. 16-20, Institute of Electrical and Electronics Engineers, New York, New York (2011).

Niu et al., "Beyond Turbo Codes: Rate-Compatible Punctured Polar Codes," IEEE ICC 2013—Communications Theory, pp. 3423-3427, Institute of Electrical and Electronics Engineers, New York, New York (2013).

Richardson et al., "Modern Coding Theory," Cambridge University Press, pp. 1-576, Cambridge, United Kingdom (Oct. 18, 2007).

* cited by examiner

RATE MATCHING METHOD AND APPARATUS FOR POLAR CODES, AND WIRELESS COMMUNICATION DEVICE

CROSS-REFERENCE TO RELATED APPLICATIONS

This application is a continuation of International Patent Application No. PCT/CN2013/086508, filed on Nov. 4, 2013, which is hereby incorporated by reference in its entirety.

TECHNICAL FIELD

The embodiments of the present application relates to the technical field of communication, and in particular, to a rate matching method and an apparatus for a polar code, and a radio communication device.

BACKGROUND

In a communication system, channel coding is usually used to improve reliability of data transmission, thereby ensuring communication quality. Recently, polar code proposed by Arikan is a first good code which is theoretically proved to be able to achieve Shannon capacity and has low complexity of encoding and decoding. After encoded with polar codes, data to be transmitted may be transmitted in a manner of hybrid automatic repeat request (HARQ). When the data encoded with the polar codes is transmitted in the manner of HARQ, puncturing is needed in the transmission, to adapt to transmission features and requirements of a channel. That is, a portion of data of the polar codes is discarded, but reception of the whole transmitted data may not be affected. In the conventional technology, a puncturing method for the HARQ is random puncturing, in which locations to be punctured are randomly determined. For example, if a code length of the polar code is 16 and the times of puncturing is 6, then 6 locations are randomly selected from the 16 locations to perform the puncturing.

In practice, it is found that the random puncturing in the HARQ leads to a relatively poor transmission performance of the polar code. The transmitted polar code has a high frame error rate, which reduces a quality of the polar code.

SUMMARY

A rate matching method and an apparatus for a polar code, and a radio communication device are provided according to the embodiments of the present application, so as to improve a transmission performance of the polar code in HARQ.

In a first aspect, a rate matching method for a polar code is provided, which includes:

determining, for the polar code outputted by an encoder, multiple candidate sets of puncturing locations, where puncturing locations indicated by any two sets of the puncturing locations are not exactly the same;

determining, for each of the multiple sets of puncturing locations, a sum of error probabilities of all bit channels for transmitting information bits of the polar code, in a case that the set of puncturing locations is applied, where the sum of the error probabilities is an upper bound of a frame error rate corresponding to the set of puncturing locations; and selecting a set of puncturing locations with a minimum upper bound of the frame error rate, from the multiple sets of puncturing locations, as a selected set of puncturing locations, and performing rate matching based on p puncturing locations indicated by the selected set of puncturing locations.

In conjunction with the first aspect, in a first possible implementation, the determining a sum of error probabilities of all bit channels for transmitting information bits of the polar code, in a case that the set of the puncturing locations is applied includes: initializing, for each of locations of code characters of the polar code, a mean value of log-likelihood ratios corresponding to the location of the code character, to obtain an initial value of the mean value of the log-likelihood ratios; updating recursively the mean value of the log-likelihood ratios, based on the initial value of the mean value of the log-likelihood ratios; obtaining an error probability of an i-th bit channel for transmitting the polar code, based on the updated mean value of the log-likelihood ratios, where the i is greater than or equal to 1 and is less than or equal to n, and the n is a code length of the polar code; and adding up the error probabilities of all the bit channels, to obtain the sum of the error probabilities.

In conjunction with the first implementation of the first aspect, in a second implementation, the updating recursively the mean value of the log-likelihood ratios includes:

$$E[L_n^{(2i-1)}] = \begin{cases} \phi^{-1}(1 - (1 - \phi(E[L_{n/2}^{(i)}(\text{up})]))\\ \quad (1 - \phi(E[L_{n/2}^{(i)}(\text{down})]))) & \text{None of them equals 0} \\ 0 & E[L_{n/2}^{(i)}(\text{up})] = 0 \\ 0 & E[L_{n/2}^{(i)}(\text{down})] = 0 \end{cases}$$

$$E[L_n^{(2i)}] = E[L_{n/2}^{(i)}(\text{up})] + E[L_{n/2}^{(i)}(\text{down})].$$

In conjunction with the first implementation of the first aspect, in a third implementation, the obtaining an error probability of an i-th bit channel for transmitting the polar code includes:

$$p_i|_{PuncMode(j)} = Q(\sqrt{E[L_n^{(i)}]/2}), \quad 1 \leq i \leq n.$$

In conjunction with the first aspect, in a fourth implementation, the performing rate matching based on p puncturing locations indicated by the selected set of puncturing locations includes: containing puncturing locations corresponding to a low code rate in puncturing locations corresponding to a high code rate.

In conjunction with any one of the first aspect and the first to fourth implementations of the first aspect, in a fifth implementation, the code length of the polar code is n, and the determining multiple candidate sets of puncturing locations includes: randomly selecting the p puncturing locations from the n codes, where the p is less than the n.

In a second aspect, a rate matching apparatus for a polar code is provided, which includes:

a determining unit, configured to determine, for the polar code outputted by an encoder, multiple candidate sets of puncturing locations, where puncturing locations indicated by any two sets of the puncturing locations are not exactly the same;

a processing unit, configured to determine, for each of the multiple sets of puncturing locations, a sum of error probabilities of all bit channels for transmitting information bits of the polar code, in a case that the set of puncturing locations is applied, where the sum of the error probabilities is an upper bound of a frame error rate corresponding to the set of puncturing locations; and a selecting unit, configured to select a set of puncturing locations with a minimum upper bound of the frame error rates, from the multiple sets of puncturing locations, as a selected set of puncturing locations; and perform rate matching based on p puncturing locations indicated by the selected set of puncturing locations.

In conjunction with the second aspect, in a first possible implementation, the processing unit includes:

an initializing subunit, configured to initialize, for each of locations of code characters of the polar code, a mean value of log-likelihood ratios corresponding to the location of the code character, to obtain an initial value of the mean value of the log-likelihood ratios;

an updating subunit, configured to update recursively the mean value of the log-likelihood ratios, based on the initial value of the mean value of the log-likelihood ratios;

a calculating subunit, configured to obtain an error probability of an i-th bit channel for transmitting the polar code, based on the updated mean value of the log-likelihood ratios, where the i is greater than or equal to 1 and is less than or equal to n, and the n is a code length of the polar code; and an adding subunit, configured to add up the error probabilities of all the bit channels, to obtain the sum of the error probabilities.

In conjunction with the first implementation of the second aspect, in a second implementation, the updating subunit is configured to perform the update based on the following equations:

$$E[L_n^{(2i-1)}] = \begin{cases} \phi^{-1}(1-(1-\phi(E[L_{n/2}^{(i)}(\text{up})])) \\ \quad (1-\phi(E[L_{n/2}^{(i)}(\text{down})]))) & \text{None of them equals 0} \\ 0 & E[L_{n/2}^{(i)}(\text{up})]=0 \\ 0 & E[L_{n/2}^{(i)}(\text{down})]=0 \end{cases}$$

$$E[L_n^{(2i)}] = E[L_{n/2}^{(i)}(\text{up})] + E[L_{n/2}^{(i)}(\text{down})].$$

In conjunction with the first implementation of the second aspect, in a third implementation, the adding subunit is configured to perform a process based on the following equations:

$$p_i|_{PuncMode(j)} = Q(\sqrt{E[L_n^{(i)}]}/2), 1 \leq i \leq n.$$

In conjunction with the second aspect, in a fourth implementation, the selecting subunit is configured to: in a process of performing the puncturing at the p puncturing locations indicated by the selected set of puncturing locations, contain puncturing locations corresponding to a low code rate in puncturing locations corresponding to a high code rate.

In conjunction with any one of the second aspect and the first to fourth implementations of the second aspect, in a fifth implementation, the determining unit is configured to determine the multiple candidate sets of puncturing locations, by randomly selecting the p puncturing locations from n codes, where the p is less than the n and the n is a code length of the polar code.

In a third aspect, a radio communication device is provided, which includes: a memory and a processor;

where the memory is configured to store instructions for performing the following operations:

determining, for the polar code outputted by an encoder, multiple candidate sets of puncturing locations, where puncturing locations indicated by any two sets of the puncturing location are not exactly the same;

determining, for each of the multiple sets of puncturing locations, a sum of error probabilities of all bit channels for transmitting information bits of the polar code, in a case that the set of puncturing locations is applied, where the sum of the error probabilities is an upper bound of a frame error rate corresponding to the set of puncturing locations; and selecting a set of puncturing locations with a minimum upper bound of the frame error rate, from the multiple sets of puncturing locations, as a selected set of puncturing locations, and performing rate matching based on p puncturing locations indicated by the selected set of puncturing locations; and the processor is coupled with the memory, and configured to execute the instructions stored in the memory.

The rate matching method and the apparatus for the polar code, and the radio communication device according to the embodiments of the present application have the following technical effects. In the embodiments of the present application, multiple puncturing solutions, obtained by a various of permutation and combination solutions, are compared, and a solution with the minimum upper bound of the frame error rate is selected as a selected puncturing solution. Compared with the random puncturing manner in the conventional technology, the frame error rate is decreased and the transmission HARQ performance of the polar code is improved.

DETAILED DESCRIPTION OF THE EMBODIMENTS

Figure 1:
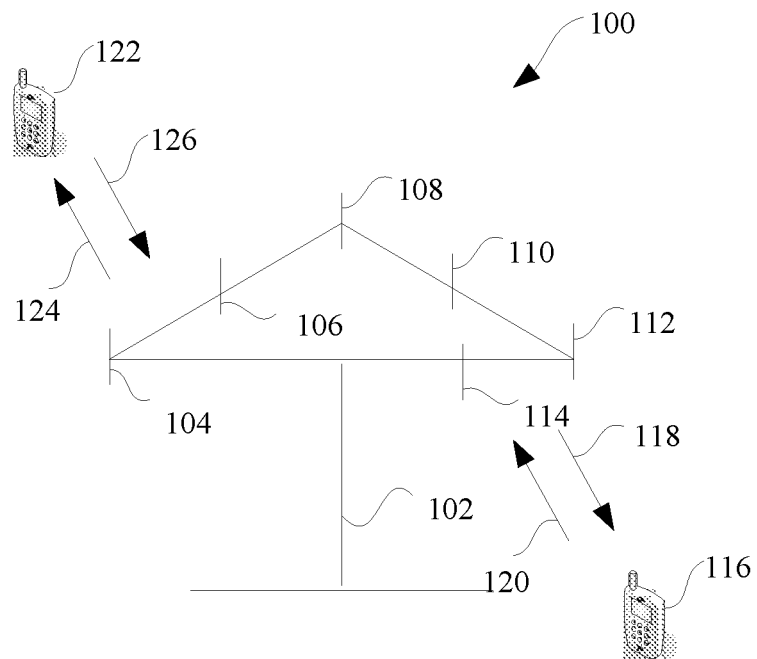
FIG. 1 illustrates a first radio communication system to which a rate matching method for a polar code according to an embodiment of the present application is applied.

Embodiments are described in conjunction with drawings, and the same reference numbers are referred to the similar elements. In the following descriptions, numerous specific details are set forth to facilitate interpreting, so as to provide comprehensive understanding of one or more embodiments. Apparently, the embodiments may be realized without the specific details. In other examples, well-known structures and devices are shown in a form of block diagrams, to facilitate describing of one or more embodiments.

Terms such as "component", "module" and "system" are used to represent a computer-related entity, hardware, firmware, combination of hardware and software, software, or software in execution. For example, the component may be, but is not limited to, a process running on a processor, a processor, an object, an executable file, an execution thread, a program or a computer. As shown in the drawings, an application running on a computing device or a computing device may be a component. One or more components may reside in a process or an execution thread, and the component may be located in one computer or be distributed in two or more computers. In addition, the components may be implemented by executing various computer readable media for storing various data structures. The components can communicate in a manner of a local or remote process based on signals including one or more data packets (such as data from two components which are interacting with another component in a local system, a distributed system and/or a network, such as Internet which interacts with other system via signals).

In addition, the embodiments are described in conjunction with an access terminal. The access terminal may also be referred to as a system, a user unit, a user station, a mobile station, a mobile platform, a remote station, a remote terminal, a mobile device, a user terminal, a terminal, a radio communication device, a user agent, a user device or a user equipment (UE). The access terminal may be a cell phone, a cordless telephone, a session initiation protocol (SIP) phone, a wireless local loop (WLL) station, a personal digital Assistant (PDA), a handheld device with a radio communication function, a computing device or other processing device which is connected with a wireless modem. In addition, the embodiments are described in conjunction with a station. The station may be configured to communicate with a mobile device, and may also be referred to as an access point, a node B, an eNode B or some other term.

In addition, various aspects or features according to the application can be implemented as a method, a device or an article of manufacture using standard programming or engineering technologies. The term "article of manufacture" used herein is intended to encompass a computer program which can be accessed from any computer readable device, carrier or medium. For example, the computer readable medium may be, but is not limited to, a magnetic storage device (such as a hard disk, a floppy disk and a magnetic tape), an optical disk (such as a compact disk (CD) and a digital versatile disk (DVD)), a smart card or a flash memory device (such as an erasable programmable read-only memory (EPROM), a card, a stick and a key driver). In addition, various storage media described herein may represent one or more devices and/or other machine readable media for storing information. The term "machine readable medium" may include, but is not limited to, a wireless channel or other medium which is capable of storing, containing and/or carrying instructions and/or data.

Reference is made to FIG. 1, which illustrates a first radio communication system to which a rate matching method for a polar code according to an embodiment of the present application is applied. A radio communication system 100 according to each of the embodiments of the present application is illustrated. The system 100 includes a base station 102 with multiple antenna groups. For example, one of the antenna groups may include antennas 104 and 106, another of the antenna groups may include antennas 108 and 110, and supplementary group may include antennas 112 and 114. In each of the multiple antenna groups, 2 antennas are illustrated, and more or less antennas may be included. The base station 102 may additionally include a transmitter chain and a receiver chain. Those skilled in the art can be understood that the transmitter chain and the receiver chain each may include multiple components related to signal transmitting and receiving (such as a processor, a modulator, a multiplexer, a demodulator, a demultiplexer and an antenna).

The base station 102 may communicate with one or more access terminals (such as an access terminal 116 and an access terminal 122). It can be understood that the base station 102 may communicate with almost any number of access terminals which are similar to the access terminals 116 and 122. The access terminals 116 and 122 each may be a cell phone, a small phone, a portable computer, a handheld communication device, a handheld computing device, a satellite radio device, a global positioning system, a PDA and/or any other proper device which is used on the radio communication system 100 to communicate. Referring to FIG. 1, the access terminal 116 communicates with the antennas 112 and 114, where the antennas 112 and 114 send information to the access terminal 116 via a forward link 118, and receive information from the access terminal 116 via a reverse link 120. In addition, the access terminal 122 communicates with the antennas 104 and 106, where the antennas 104 and 106 send information to the access terminal 122 via a forward link 124, and receive information from the access terminal 122 via a reverse link 126. In a frequency division duplex (FDD) system, for example, the forward link 118 may utilize a frequency band different from the reverse link 120, and the forward link 124 may utilize a frequency band different from the reverse link 126. In addition, in a time division duplex (TDD) system, the forward link 118 and the reverse link 120 may utilize the same frequency band, and the forward link 124 and the reverse link 126 may utilize the same frequency band.

Each of the antenna groups and/or regions which are designed to communicate is referred to as a sector of the base station 102. For example, the antenna group may be designed to communicate with an access terminal located in a sector in a coverage region of the based station 102. In a communication via the forward link 118 and the forward link 124, transmitting antennas of the base station 102 may improve signal-to-noise ratios of the forward links 118 and 124 of the access terminals 116 and 122 with beamforming. In addition, compared with a case that the base station performs the transmission to all the access terminals with a single antenna, the base station 102, which performs the transmission by beamforming to the access terminals 116 and 122 randomly distributed in the related coverage region, may generate less interference with mobile devices in an adjacent cell.

In a given time, the base station 102, the access terminal 116 and/or the access terminal 122 each may be a radio communication transmitting device and/or a radio communication receiving device. In a process of transmitting data, the radio communication transmitting device may encode the data to transmit. Specifically, the radio communication transmitting device may have (such as generate, obtain, or store in a memory) a predetermined number of information bits to be transmitted to the radio communication receiving device via a channel. The information bits may be carried in a transmission block (or multiple transmission blocks) of the data, which may be divided to form multiple code blocks. In addition, the radio communication transmitting device may encode each of the code blocks with a polar code encoder (not shown).

A method for calculating puncturing locations in HARQ transmission is provided according to an embodiment of the present application, so as to improve a transmission performance of a polar code in the HARQ. HARQ puncturing refers to that a portion of data of the polar code is removed without being transmitted, before data encoded with the polar code is transmitted, so as to adapt to requirements of a transmission channel. The concept of the HARQ puncturing is a conventional technology, which is not described herein. A method for determine the puncturing locations is provided according to the embodiment of the present application. For example, the n is a code length of the polar code after the data to be transmitted is encoded, and the p is the required times of puncturing based on the requirements of transmission channel. In this case, the following embodiments of the present application focus on a process of selecting p puncturing locations from n locations.

Figure 2:
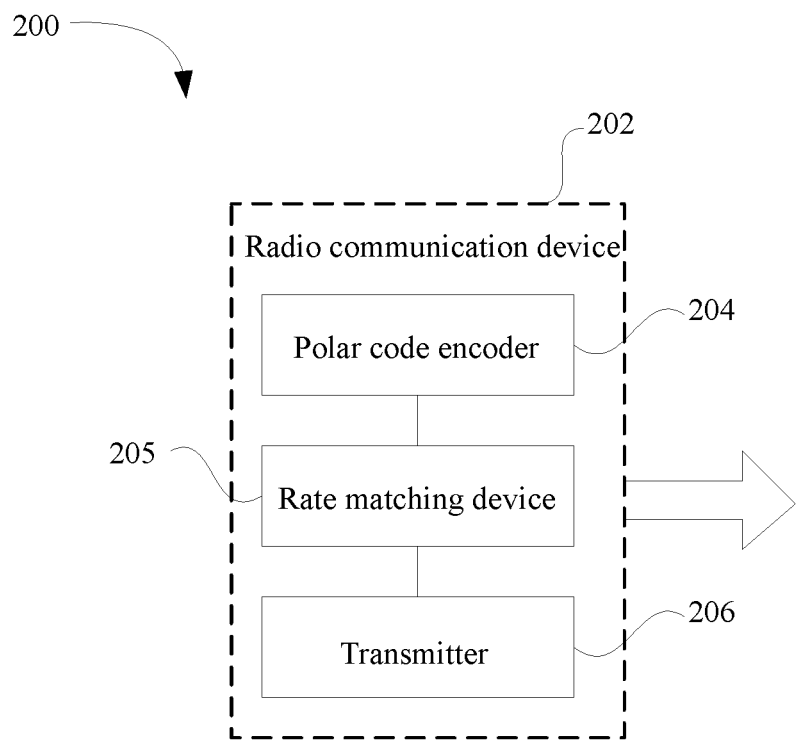
FIG. 2 illustrates a second application system of a rate matching method for a polar code according to an embodiment of the present application.

Reference is made to FIG. 2, which illustrates a second application system of a rate matching method for a polar code according to an embodiment of the present application, In FIG. 2, a system 200 is illustrated, which perform rate matching in a radio communication environment, with an algorithm based on a circular buffer. The system 200 includes a radio communication device 202 which is illustrated to transmit data via a channel. Although being illustrated to transmit the data, the radio communication device 202 may receive data via a channel (for example, the radio communication device 202 can transmit and send data at a same time, at different times, or at a combination thereof). The radio communication device 202 may be a base station (such as the base station 102 in FIG. 1), an access terminal (such as the access terminal 116 in FIG. 1 or the access terminal 122 in FIG. 1) and so on.

The radio communication device 202 may include a polar code encoder 204, a rate matching device 205 and a transmitter 206.

The polar code encoder 204 is configured to encode data to be transmitted by the radio communication device 202.

The rate matching device 205 is configured to: determine, for the polar code outputted by the polar code encoder 204, multiple candidate sets of puncturing locations, where puncturing locations indicated by any two sets of the puncturing locations are not exactly the same; determine, for each of the multiple sets of puncturing locations, a sum of error probabilities of all bit channels for transmitting information bits of the polar code, in a case that the set of puncturing location is applied, where the sum of the error probabilities is referred to as an upper bound of a frame error rate corresponding to the set of puncturing locations; and select a set of puncturing locations with a minimum upper bound of the frame error rate, from the multiple sets of puncturing locations, as a selected set of puncturing locations, and perform rate matching based on p puncturing locations indicated by the selected set of puncturing locations.

In addition, the transmitter 206 may subsequently transmit on a channel data processed by the rate matching device 205. For example, the transmitter 206 may send related data to other radio communication devices (not shown).

Figure 3:
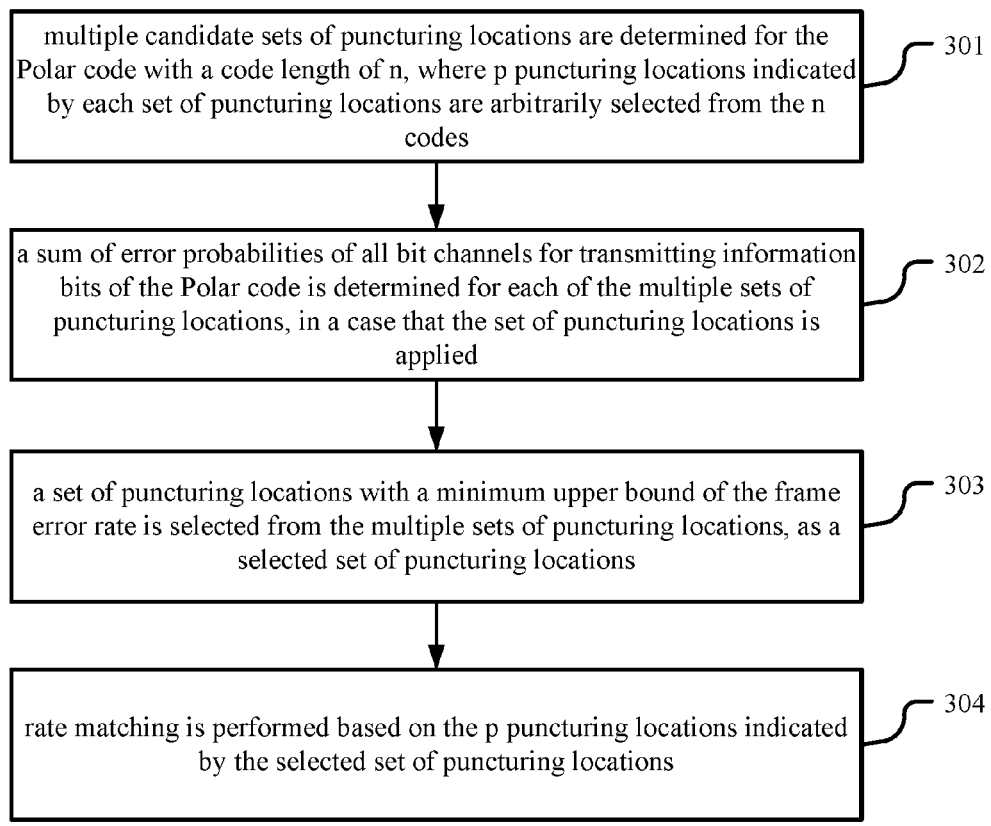
FIG. 3 is a schematic flow chart of a rate matching method for a polar code according to an embodiment of the present application.

FIG. 3 is a schematic flow chart of a rate matching method for a polar code according to an embodiment of the present application. The method may be executed by a rate matching device for the polar code which is located at a data transmitting end. That is, the method may be executed by the rate matching device 205 illustrated in FIG. 2. In addition, it is assumed that the embodiment is applied to a rate matching scenario, in which after the data coding is performed, a code length of the polar code is n and the required times of puncturing is p (the p is less than the n). As shown in FIG. 3, the method may include the follows.

In 301, multiple candidate sets of puncturing locations are determined for the polar code with a code length of n, where p puncturing locations indicated by each set of puncturing locations are arbitrarily selected from the n codes.

Recording forms of the multiple sets of puncturing locations are not limited, which may be a table, a form for carrying information such as character string, or may be represented by a puncturing indicating vector, such as (11100000 . . . 0.0000), where 0 represent puncturing, and the 1 represents no puncturing.

Multiple permutation and combination solutions are provided by arbitrarily selecting p locations from the n locations, which is $C_n^p$ in total. For example, it is assumed that the n is equal to 5 and the p is equal to 3. Then, there are multiple selecting solutions to arbitrarily select 3 locations from 5 locations.

The selected puncturing locations in any two of the solutions are different from each other. In the embodiment of the present application, a group of the puncturing locations corresponding to one solution is referred to as a set of puncturing locations. Each of the sets of puncturing locations includes the p puncturing locations selected by the solution. The puncturing locations indicated by any two sets of the puncturing locations are not exactly the same.

In 302, a sum of error probabilities of all bit channels for transmitting information bits of the polar code is determined for each of the multiple sets of puncturing locations, in a case that the set of puncturing locations is applied.

In the embodiment, the solutions corresponding to the multiple sets of puncturing locations determined in the step 301 are compared, for example, by determining the sum of the error probabilities of all the bit channels of the information bits corresponding to each solution of the set of puncturing locations; and the sum of the error probabilities is referred to as an upper bound of a frame error rate, which may be represented as FER_UpperBound.

For example, the number of the bit channels for transmitting the information bits of the polar code is k. In this case, for each solution of the set of puncturing locations, an error probability of an i-th bit channel (the i-th channel is any one of the k bit channels) is calculated, when the puncturing is performed based on the solution; and then the error probabilities of all the bit channels are added up to obtain the upper bound of the frame error rate.

In 303, a set of puncturing locations with a minimum upper bound of the frame error rate is selected from the multiple sets of puncturing locations, as a selected set of puncturing locations.

According to the embodiment, a set of puncturing locations with the minimum upper bound of the frame error rate is selected as the selected set of puncturing locations. That is, HARQ with best performance may be obtained by puncturing at the puncturing locations corresponding to the selected set of puncturing locations.

In 304, rate matching is performed based on the p puncturing locations indicated by the selected set of puncturing locations.

In the rate matching method for the polar code according to the embodiment, multiple permutation and combination solutions for puncturing are compared, and the solution with a minimum upper bound of the frame error rate is selected as a selected solution for puncturing. Compared with the random puncturing manner in the conventional technology, the frame error rate is decreased and the transmission performance of the polar code in the HARQ is improved.

Figure 4:
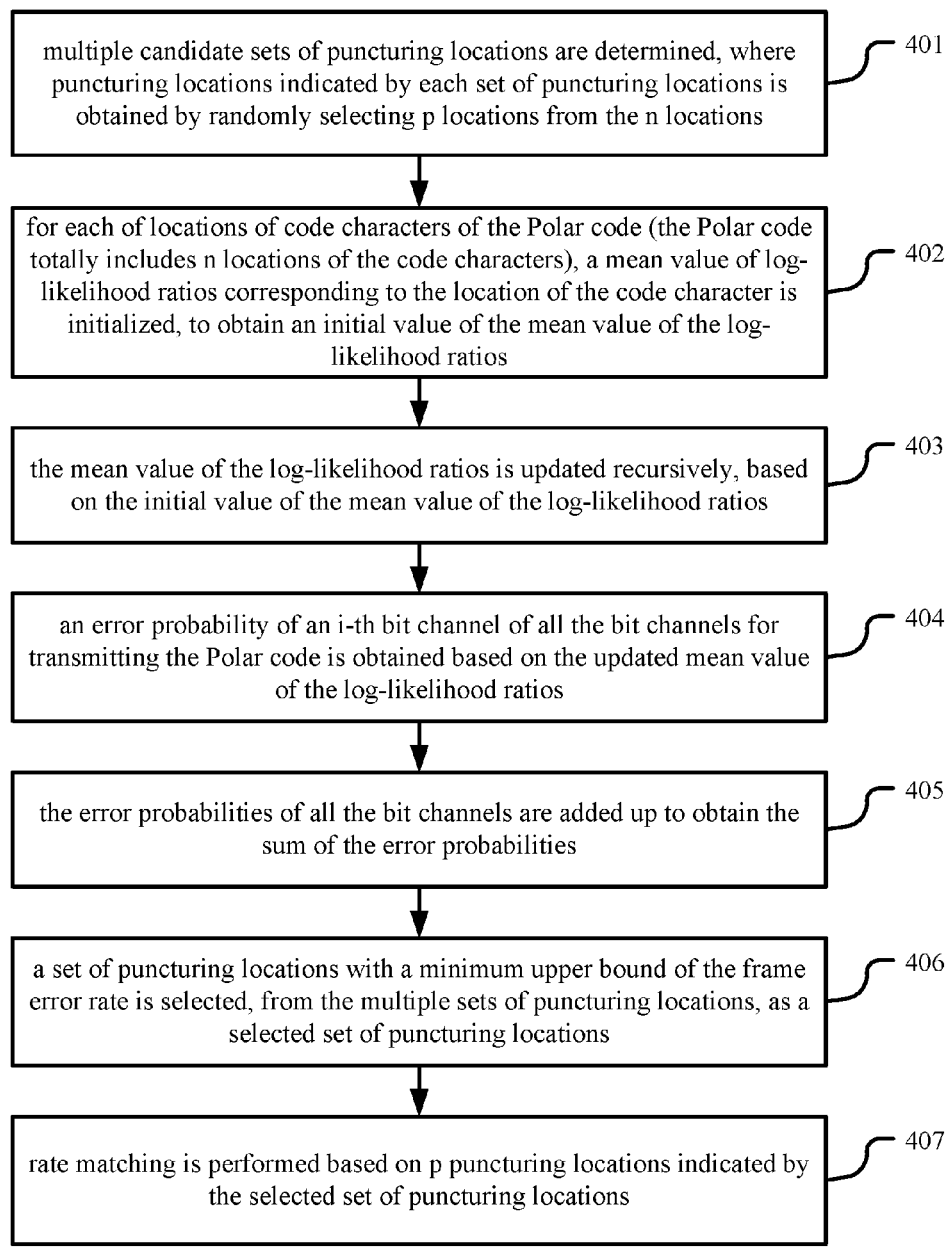
FIG. 4 is a schematic flow chart of a rate matching method for a polar code according to another embodiment of the present application.

FIG. 4 is a schematic flow chart of a rate matching method for a polar code according to another embodiment of the present application. The rate matching method for the polar code is described in more detail in the embodiment. As shown in FIG. 4, the method may include the follows.

In 401, multiple candidate sets of puncturing locations are determined, where puncturing locations indicated by each set of puncturing locations is obtained by randomly selecting p locations from the n locations.

There are multiple permutation and combination solutions to randomly select the p locations from the n locations, which is $C_n^p$ in total.

Then, a sum of error probabilities of all bit channels, which transmit information bits of the polar code and correspond to each set of puncturing locations, is determined for the set of puncturing locations. The process of determining the sum includes the following 402 to 405.

In 402, for each of locations of code characters of the polar code (the polar code in total includes n locations of the code characters), a mean value of log-likelihood ratios corresponding to the location of the code character is initialized, to obtain an initial value of the mean value of the log-likelihood ratios.

The initializing may be performed based on the following method, to obtain the initial value $E[L_1^{(i)}(y_i)]$ of the mean value of the log-likelihood ratios:

$$E[L_1^{(i)}(y_i)] = \begin{cases} \frac{2}{\sigma^2} & \text{if NoPuncturing } x(i) \\ 0 & \text{if puncturing } x(i) \end{cases}$$

let: $L_{n/2}^{(i)}(y_1^{n/2}, \hat{u}_{1,e}^{2i-2} \oplus \hat{u}_{1,o}^{2i-2}) = L_{n/2}^{(i)}(\text{up})$ $L_{n/2}^{(i)}(y_{n/2+1}^n, \hat{u}_{1,e}^{2i-2}) = L_{n/2}^{(i)}(\text{down})$ where 1<i<n, the E indicates averaging, the y is a received signal, e represents an even item of index, o represents an odd item of index, and u represents input bits.

In 403, the mean value of the log-likelihood ratios is updated recursively, based on the initial value of the mean value of the log-likelihood ratios.

In the embodiment, the mean value of the probability densities are updated with an order and a structure which are the same as those of successive cancellation SC decoding, based on an assumption theory of Gaussian approximation. Specifically, the updating may be performed with standard LLR updating equations of the SC decoding:

$L_n^{(2i-1)}(y_1^n, \hat{u}_1^{2i-2}) = 2\tanh^{-1}(\tanh(L_{n/2}^{(i)}(y_1^{n/2}, \hat{u}_{1,e}^{2i-2} \oplus \hat{u}_{1,o}^{2i-2})/2) \times$
$\tanh(L_{n/2}^{(i)}(y_{n/2+1}^n, \hat{u}_{1,e}^{2i-2})/2))$, $L_n^{(2i)}(y_1^n, \hat{u}_1^{2i-1}) = L_{n/2}^{(i)}(y_{n/2+1}^n, \hat{u}_{1,e}^{2i-2}) +$
$(-1)^{\hat{u}_{2i-1}} L_{n/2}^{(i)}(y_1^{n/2}, \hat{u}_{1,e}^{2i-2} \oplus \hat{u}_{1,o}^{2i-2})$, it may be redescribed with a convolution in an L domain and a G domain as follows:

$a_{2N}^{(2i)} = a_N^{(i)} \star a_N^{(i)}, a_{2N}^{(2i-1)} = a_N^{(i)} \boxast a_N^{(i)}, a_1^{(1)} = a_W$ where the L domain and the G domain may refer to the book "Modern Coding Theory", authors of which are Tom Richardson and Ruediger Urbanke.

A multidimensional convolution needs to be calculated when density evolution is applied to updating of each node, the dimension is equal to the number of intervals for quantization. Generally, the longer the corresponding code length, the more the number of the intervals for quantization. Hence, the whole updating process has a high complexity. The updating process according to the embodiment is based on the Gaussian approximation, which assumes that the probability density in the process satisfies Gaussian distribution. Hence, instead of the multidimensional convolution, only a one-dimensional convolution is needed to be calculated.

The Gaussian approximation method is described as follows:

it may be proven that the probability density satisfies the following Gauss distribution:

$$L_1^{(i)}(y_i) \in N\left(\frac{2}{\sigma_n^2}, \frac{4}{\sigma_n^2}\right)$$

Recursive rule of the mean value of the log-likelihood ratio is listed as follows, based on the Gaussian approximation:

$$E[L_n^{(2i)}] = 2E[L_{n/2}^{(i)}]$$

$$E[L_n^{(2i-1)}] = \varphi^{-1}\left(1 - (1 - \varphi(E[L_{n/2}^{(i)}]))^2\right)$$

$$\phi(x) = \begin{cases} 1 - \frac{1}{\sqrt{4\pi x}} \int_{-\infty}^{+\infty} \tanh\frac{u}{2} e^{-\frac{(u-x)^2}{4x}} du & x > 0 \\ 1 & x = 0 \end{cases}$$

Based on the above Gaussian approximation theory, the updating rules of the mean value of the log-likelihood ratio is listed as follows:

$$E[L_n^{(2i-1)}] = \begin{cases} \phi^{-1}(1 - (1 - \phi(E[L_{n/2}^{(i)}(\text{up})])) & \\ (1 - \phi(E[L_{n/2}^{(i)}(\text{down})]))) & \text{None of them equals 0} \\ 0 & E[L_{n/2}^{(i)}(\text{up})] = 0 \\ 0 & E[L_{n/2}^{(i)}(\text{down})] = 0 \end{cases}$$

$$E[L_n^{(2i)}] = E[L_{n/2}^{(i)}(\text{up})] + E[L_{n/2}^{(i)}(\text{down})]$$

$E[L_n^{(2i)}] = E[L_{n/2}^{(i)}(\text{up})] + E[L_{n/2}^{(i)}(\text{down})]$

In 404, an error probability of an i-th bit channel of all the bit channels for transmitting the polar code is obtained based on the updated mean value of the log-likelihood ratios.

The error probability of the i-th bit channel is obtained based on the following equation:

$p_i|_{PuncMode(j)} = Q(\sqrt{E[L_n^{(i)}]/2})$, $1 \leq i \leq n$, where the Q is a Q function.

In 405, the error probabilities of all the bit channels are added up to obtain the sum of the error probabilities.

$$\text{FER\_UpperBound}\bigg|_{PuncMode(j)} = \sum_{i \in A} p_i\bigg|_{PuncMode(j)}.$$

The equation represents the sum of the error probabilities of all the bit channels corresponding to a j-th set of puncturing locations (the PuncMode(j) represents the j-th puncturing solution), where j=1 . . . $C_n^p$. FER_UpperBound corresponding to each set of puncturing locations may be obtained by the above 402 to 405.

In 406, a set of puncturing locations with a minimum upper bound of the frame error rate is selected, from the multiple sets of puncturing locations, as a selected set of puncturing locations.

FER_UpperBound is calculated for each of the puncturing solutions, and then the final puncturing solution is selected based on the following principle:

$$PuncMode = \min_j \{FER\_UpperBound|_{PuncMode(j)}\}$$

that is, the set of puncturing locations with the minimum upper bound of the frame error rates is selected.

In 407, rate matching is performed based on p puncturing locations indicated by the selected set of puncturing locations.

The rate matching, i.e., puncturing, is performed at p puncturing locations indicated by the selected set of puncturing locations. This process includes: containing puncturing locations corresponding to a low code rate in puncturing locations corresponding to a high code rate.

For example, assuming that the code length of the polar code is n, the number of the information bits is k, in a case that a code rate is R1 and the times of puncturing is p1, then R1=k/(n−p1); and in a case that the times of puncturing is p2, then a code rate is R2=k/(n−p2), where the code rates R2<R1. In this case, the puncturing locations corresponding to the times of puncturing p1 contain the puncturing locations corresponding to the times p2 of puncturing, that is, $P_1 \supseteq P_2$.

Figure 5:
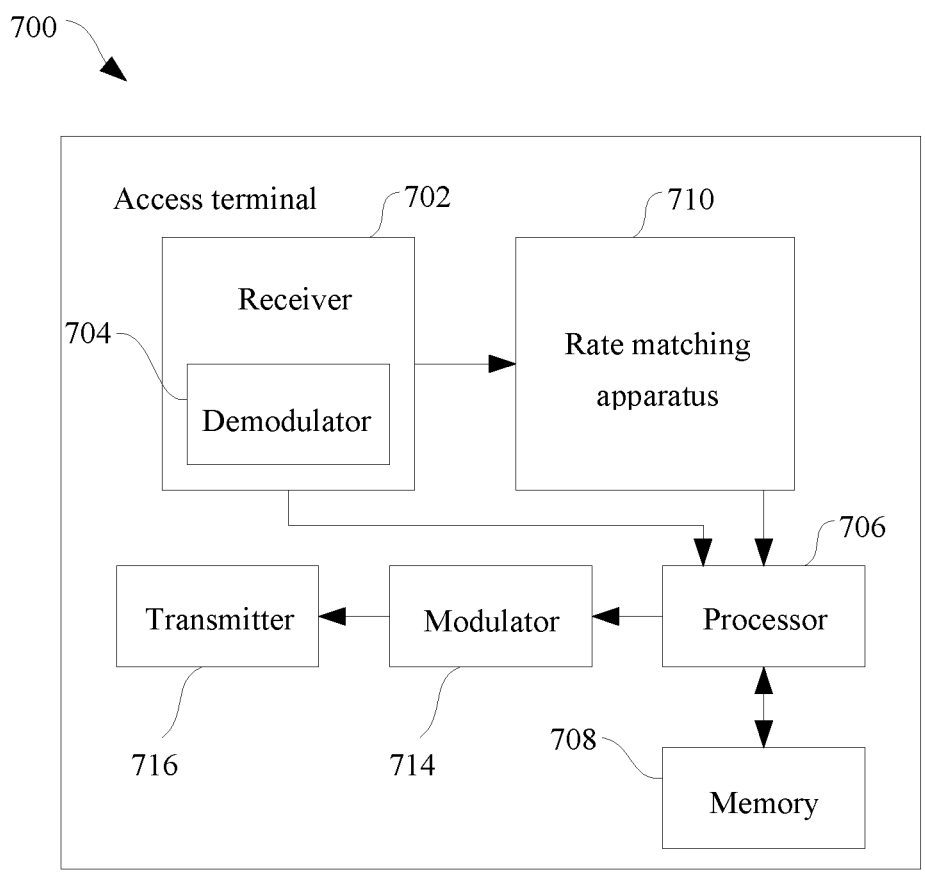
FIG. 5 is a schematic diagram of an access terminal in a rate matching method for a polar code according to another embodiment of the present application.

FIG. 5 is a schematic diagram of an access terminal in a rate matching method for a polar code according to another embodiment of the present application. The access terminal 700 as shown in FIG. 5 facilitates implementing the above rate matching method for polar code in a radio communication system. The access terminal 700 includes a receiver 702 configured to receiver a signal from a receiving antenna (not shown), perform a typical action (such as filtering, amplifying and down converting) on the received signal, and digitize the adjusted signal to sample. The receiver 702 may be a MEMS receiver. The access terminal 700 may further include a demodulator 704 configured to demodulate received characters, and provide the demodulated characters to a processor 706 for performing channel estimation. The processor 706 may be a processor specifically configured to analyze information received by the receiver 702 and/or generate information to be transmitted by a transmitter 716, a processor configured to control one or more components of the access terminal 700, and/or a controller configured to analyze information received by the receiver 702, generate information to be transmitted by a transmitter 716, and control one or more components of the access terminal 700.

The access terminal 700 may further include a memory 708 operably coupled with the processor 706 and storing the following pieces of data: data to be transmitted, received data and any other proper information which is related to various actions and functions for performing texts. The memory 708 may additionally store a protocol and/or algorithm which are related to the rate matching.

It can be understood that the data storage device described herein (such as the memory 708) may be a volatile memory or a nonvolatile memory, or may include both a volatile memory and a nonvolatile memory. By means of illustration, a nonvolatile memory may include, but is not limited to: a read only memory (ROM), a programmable ROM (PROM), an electrically programmable ROM (EPROM), an electrically erasable PROM (EEPROM) or a flash memory. A volatile memory may include: a random access memory (RAM), which acts as an external cache. By means of illustration, rather than limitation, a various of RAMs are available, such as a synchronous RAM (SRAM), a dynamic RAM (DRAM), a synchronous DRAM (SDRAM), a double data rate SDRAM (DDR SDRAM), an enhanced SDRAM (ESDRAM), a SynchlinkDRAM (SLDRAM) and a direct Rambus RAM (DRRAM). The memory 708 in the system and method described herein is intended to includes, but is not limited to, these and any other suitable types of memories.

In practical application, the receiver 702 may be coupled with a rate matching apparatus 710. The rate matching apparatus 710 may be similar to the rate matching device 205 in FIG. 2. In addition, it can be understood that the access terminal 700 may include a polar code encoder which is not illustrated. The polar code encoder is basically similar to the polar code encoder 204 in FIG. 2. The rate matching apparatus 710 may be similar to the rate matching device 205 in FIG. 2. The rate matching apparatus 710 may be configured to: determine, for the polar code outputted by the polar code encoder, multiple candidate sets of puncturing locations, where puncturing locations indicated by any two sets of the puncturing locations are not exactly the same; determine, for each of the multiple sets of puncturing locations, a sum of error probabilities of all bit channels for transmitting information bits of the polar code, in a case that the set of puncturing locations is applied, where the sum of the error probabilities is referred to as an upper bound of a frame error rate corresponding to the set of puncturing locations; and select a set of puncturing locations with a minimum upper bound of the frame error rate, from the multiple sets of puncturing locations, as a selected set of puncturing locations, and perform rate matching based on p puncturing locations indicated by the selected set of puncturing locations.

The access terminal 700 further includes a modulator 714, and a transmitter 716 configured to send a signal to a base station, another access terminal, and so on. Although it is illustrated that the rate matching apparatus 710 and/or the modulator 714 are/is separated from the processor 706, it can be understood that they may be a part of the processor 706 or multiple processors (not shown).

Figure 6:
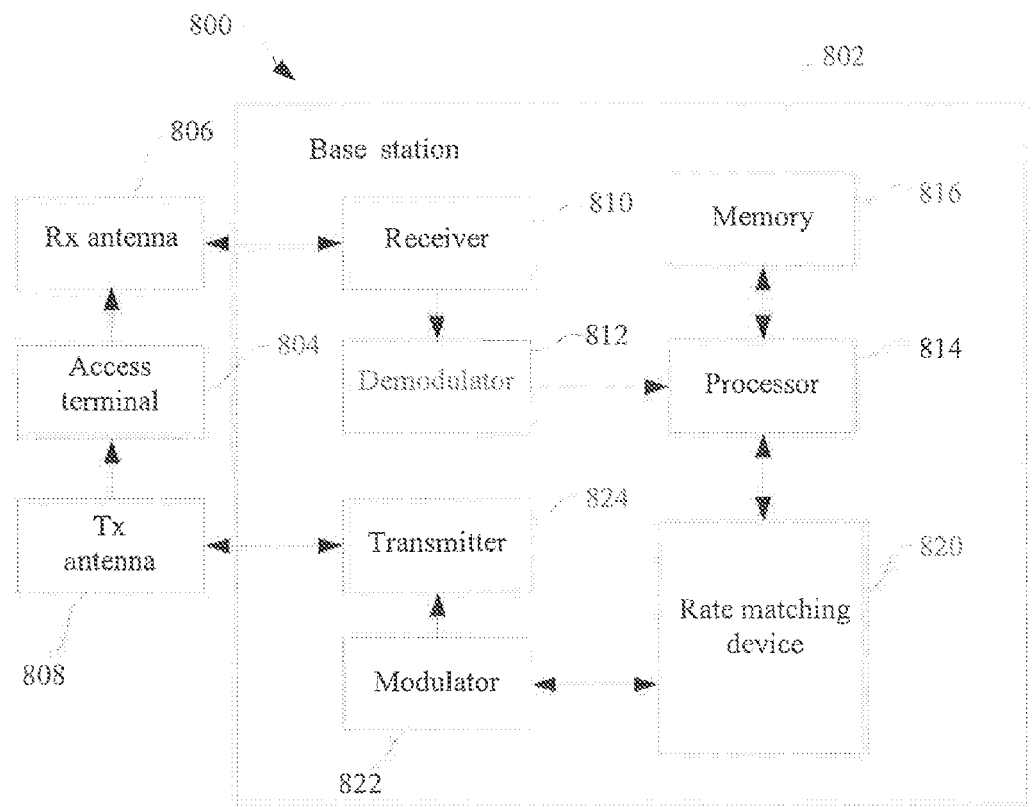
FIG. 6 illustrates a third application system of a rate matching method for a polar code according to an embodiment of the present application.

FIG. 6 illustrates a third application system in a rate matching method for a polar code according to an embodiment of the present application, which is a schematic diagram of the system 800 for implementing the above rate matching method for the polar code in a radio communication environment. The system 800 includes a base station 802 (such as an access point). The base station 802 may include a receiver 810 configured to receive signals from one or more access terminals 804 via multiple receiving antennas 806, and a transmitter 824 configured to transmit a signal to one or more access terminals 804 via a transmitting antenna 808. The receiver 810 may receives information from the receiving antennas 806, and may be operably associated with a demodulator 812 which demodulates the received information. The demodulated characters are analyzed by a processor 814 which is similar to the processor described in FIG. 5. The processor is connected to a memory 816. The memory 816 is configured to store data to be transmitted to the access terminal 804 (or another base station (not shown)), data received from the access terminal 804 (or another base station (not shown)), and/or any other proper information which is related to various actions and functions for performing texts. The processor 814 may be coupled with a rate matching device 820. The rate matching device 820 may perform the rate matching, based on puncturing locations corresponding to a minimum of frame error rate of all bit channels. For example, multiple candidate sets of puncturing locations may be determined; a sum of error probabilities of all bit channels for transmitting information bits of the polar code may be determined for each of the multiple sets of puncturing locations, in a case that the set of puncturing locations is applied; and a set of puncturing locations with a minimum upper bound of the frame error rate is selected, as a selected set of puncturing location; and rate matching is performed based on puncturing locations indicated by the selected set of puncturing locations.

In addition, it can be understood that the base station 102 may include a polar code encoder which is not illustrated. The polar code encoder is basically similar to the polar encoder 204 in FIG. 2. A modular 822 may multiplex a frame, and then the multiplexed frame may be transmitted by a transmitter 824 to the access terminal 804 via the antenna 808. Although it is illustrated that the rate matching device 820 and the modulator 822 are separated from the processor 814, it can be understood that they may be a part of the processor 814 or multiple processors (not shown).

It can be understood that, the embodiments described herein can be implemented in hardware, software, firmware, middleware, microcode, or any combination thereof. For a hardware implementation, processing units may be implemented in one or more application specific integrated circuits (ASIC), digital signal processors (DSP), digital signal processing devices (DSPD), programmable logic devices (PLD), field programmable gate arrays (FPGA), processors, controllers, micro-controllers, microprocessors, other electronic units configured to perform the functions of the application, or a combination thereof.

When the embodiments are implemented in software, firmware, middleware or microcode, program code or code segment, they may be stored in a machine readable medium, such as a storage component. The code segment may represent a process, a function, a subprogram, a program, a routine, a subroutine, a module, a software package, a class, or any combination of instructions, data structures or program statements. The code segment may be coupled with another code segment or a hardware circuit, by transmitting and/or receiving information, data, independent variables, parameters, or memory contents. Information, independent variables, parameters, data, and so on, may be passed, forwarded or transmitted by any suitable means, such as memory sharing, message passing, token passing, network transmission.

In a software implementation, the technologies described herein may be implemented by modules (such as processes, functions) for performing the functions described herein. Software codes may be stored in a memory unit and be executed by a processor. The memory unit may be implemented in the processor or outside the processor. In the latter case, the memory unit may be communicatively coupled with the processor by various means known in the art.

Figure 7:
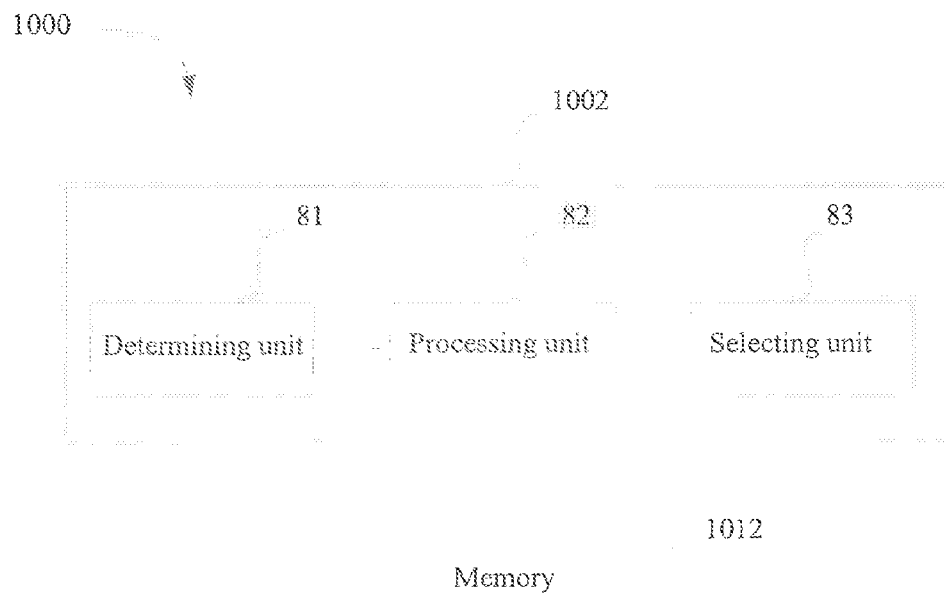
FIG. 7 illustrates a fourth application system of a rate matching method for a polar code according to an embodiment of the present application.

Reference is made to FIG. 7, which illustrates a fourth application system in a rate matching method for a polar code according to an embodiment of the present application.

A system 1000 shown in FIG. 7 may perform the rate matching method in a radio communication environment. For example, the system 1000 may at least partially reside in a base station. According to another example, the system 1000 may at least partially reside in an access terminal. It should be understood that that system 1000 may be represented as including functional blocks. The functional blocks may represent functions implemented by a processor, software, or a combination thereof (such as firmware). The system 1000 includes a logical grouping 1002 having electrical components operated in conjunction. For example, the logical grouping 1002 may include a determining unit 81, a processing unit 82 and a selecting unit 83.

The determining unit 81 is configured to determine, for the polar code outputted by an encoder, multiple candidate sets of puncturing locations, where puncturing locations indicated by any two sets of the puncturing locations are not exactly the same.

The processing unit 82 is configured to determine, for each of the multiple sets of puncturing locations, a sum of error probabilities of all bit channels for transmitting information bits of the polar code, in a case that the set of puncturing locations is applied, where the sum of the error probabilities is referred to as an upper bound of a frame error rate corresponding to the set of puncturing locations.

The selecting unit 83 is configured to select a set of puncturing locations with a minimum upper bound of the frame error rate, from the multiple sets of puncturing locations, as a selected set of puncturing location; and perform rate matching based on p puncturing locations indicated by the selected set of puncturing locations.

In addition, the system 1000 may include a memory 1012, which stores instructions to perform functions related to the electrical components including the determining unit 81, the processing unit 82 and the selecting unit 83. Although being illustrated outside the memory 1012, it can be understood that one or more of the determining unit 81, the processing unit 82 and the selecting unit 83 may be stored in the memory 1012.

The above descriptions include examples of one or more embodiments. Certainly, it is not possible to describe all possible combinations of components or methods to describe the above embodiments. However, those skilled in the art may recognize that the embodiments are further combined and transformed. Therefore, the embodiments described herein are intended to include all alterations, modifications and variations that fall within the spirit and scope of the appended claims. In addition, the term "include" used in the description or in the claims is intended to be inclusive in a manner similar to the term "comprise", as the term "comprise" is interpreted when employed as a transitional word in the claims.

Figure 8:
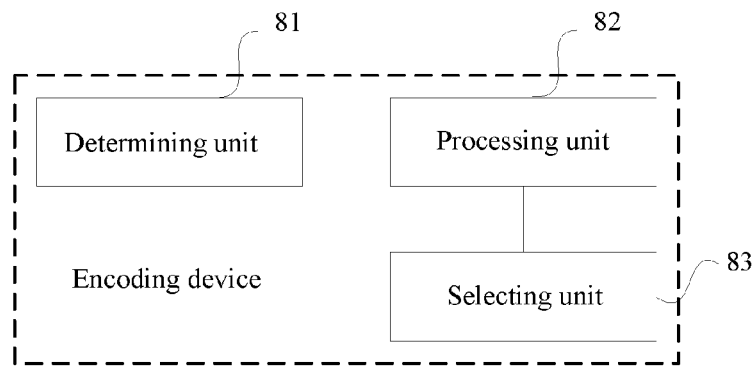
FIG. 8 is a schematic structural diagram of a rate matching apparatus for a polar code according to an embodiment of the present application.

FIG. 8 is a schematic structural diagram of a rate matching apparatus for a polar code according to an embodiment of the present application. The apparatus is applied to a puncturing scenario that a code length of the polar code is n and the required times of puncturing is p, and the p is less than the n. The apparatus may implement the method according to any embodiment of the present application. As shown in FIG. 8, the rate matching apparatus for the polar code may include: a determining unit 81, a processing unit 82 and a selecting unit 83.

The determining unit 81 is configured to determine, for the polar code outputted by an encoder, multiple candidate sets of puncturing locations, where puncturing locations indicated by any two sets of the puncturing locations are not exactly the same.

The processing unit 82 is configured to determine, for each of the multiple sets of puncturing locations, a sum of error probabilities of all bit channels for transmitting information bits of the polar code, in a case that the set of puncturing locations is applied, where the sum of the error probabilities is referred to as an upper bound of a frame error rate corresponding to the set of puncturing locations.

The selecting unit 83 is configured to select a set of puncturing locations with a minimum upper bound of the frame error rate, from the multiple sets of puncturing locations, as a selected set of puncturing locations; and perform rate matching based on p puncturing locations indicated by the selected set of puncturing locations.

Figure 9:
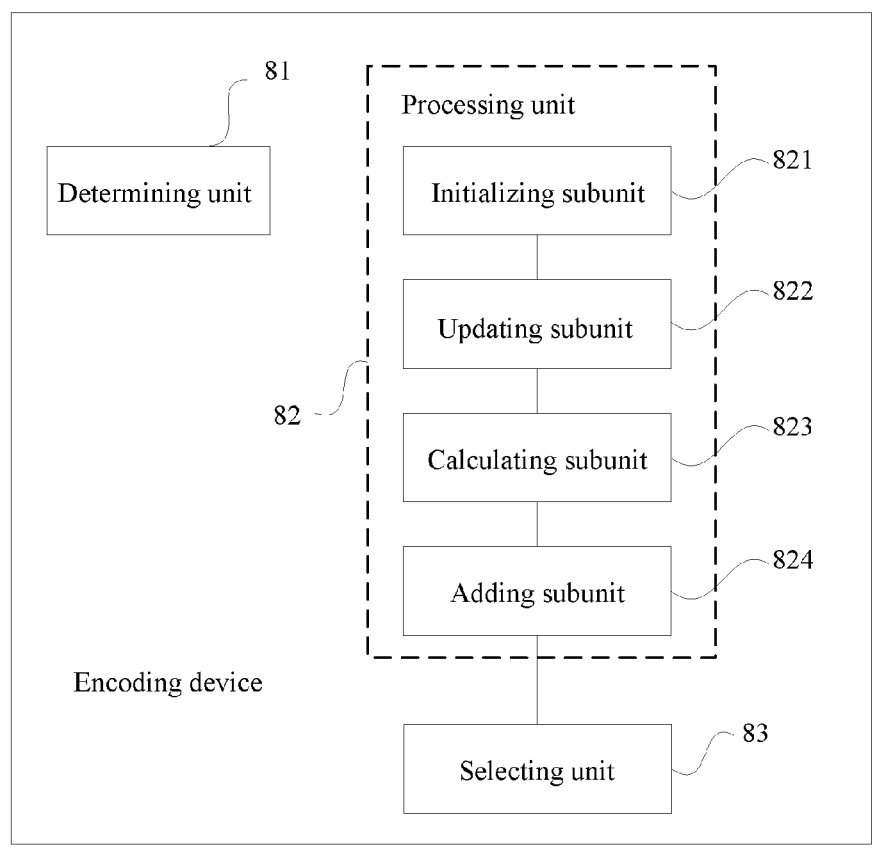
FIG. 9 is a schematic structural diagram of a rate matching apparatus for a polar code according to another embodiment of the present application.

FIG. 9 is a schematic structural diagram of a rate matching apparatus for a polar code according to an embodiment of the present application. As shown in FIG. 9, based on the structure illustrated in FIG. 8, the processing unit 82 of the apparatus may include: an initializing subunit 821, an updating subunit 822, a calculating subunit 823 and an adding subunit 824.

The initializing subunit 821 is configured to initialize, for each of locations of code characters of the polar code, a mean value of log-likelihood ratios corresponding to the location of the code character, to obtain an initial value of the mean value of the log-likelihood ratios.

The updating subunit 822 is configured to update recursively the mean value of the log-likelihood ratios, for each bit channel from the 1-th bit channel to the n-th bit channel, based on the initial value of the mean value of the log-likelihood ratios.

The calculating subunit 823 is configured to obtain an error probability of an i-th bit channel for transmitting the polar code, based on the updated mean value of the log-likelihood ratios, where the i is greater than or equal to 1 and is less than or equal to n.

The adding subunit 824 is configured to add up the error probabilities of all the bit channels, to obtain the sum of the error probabilities.

Furthermore, the updating subunit 822 is configured to performing the update based on the following equations:

$$E[L_n^{(2i-1)}] = \begin{cases} \phi^{-1}(1-(1-\phi(E[L_{n/2}^{(i)}(up)])) \\ (1-\phi(E[L_{n/2}^{(i)}(down)])) & \text{None of them equals 0} \\ 0 & E[L_{n/2}^{(i)}(up)] = 0 \\ 0 & E[L_{n/2}^{(i)}(down)] = 0 \end{cases}$$

$$E[L_n^{(2i)}] = E[L_{n/2}^{(i)}(up)] + E[L_{n/2}^{(i)}(down)].$$

Furthermore, the adding subunit 824 is configured to perform a process based on the following equation:

$$p_i|_{PuncMode(j)} = Q(\sqrt{E[L_n^{(i)}]/2}), 1 \leq i \leq n,$$

Furthermore, the selecting subunit 83 is configured to: in a process of performing the puncturing at the p puncturing locations indicated by the selected set of puncturing locations, contain puncturing locations corresponding to a low code rate in puncturing locations corresponding to a high code rate.

Furthermore, the determining unit 81 is used to determine the multiple candidate sets of puncturing locations, by randomly selecting the p puncturing locations from n codes, where the p is less than the n and the n is a code length of the polar code.

Based on the rate matching method for the polar code and the related apparatus, the HARQ performance of the polar code is significantly improved. Taking a case that the code length n of the polar is 16, the number of the information bits is 5, the times of puncturing is 6 as an example. The polar code is decoded with SC decoding. If the HARQ performance is evaluated with a bit error rate (BER), then compared with a random puncturing (i.e., rand punc) solution, the BER may be improved by 1.5 dB with the solution (i.e., Proposed Bound-based punc) in the embodiments of the present application in a condition of BER=$10^{-3}$.

Similarly, taking a case that the code length n of the polar is 16, the number of the information bits is 5, the times of puncturing is 6 as an example. The polar code is decoded with SC decoding. If the HARQ performance is evaluated with a frame error rate (FER), then compared with a random puncturing (i.e., rand punc) solution, the FER may be improved by 1 dB with the solution (i.e., Proposed Bound-based punc) in the embodiments of the present application in a condition of FER=$10^{-2}$.

It can be understood by those skilled in the art that all or some of the steps in the above method embodiments may be performed by program instructing relevant hardware. The program may be stored in a computer readable storage medium. When the program is performed, steps in the above method embodiments are performed. The above storage medium may include a medium which can store program codes, such as random access memory (RAM), read-only memory (ROM), a magnetic disk or an optical disk.

The rate matching method and apparatus for the polar code according to the embodiments of the present application may be applied to (but is not limited to) a communication device, such as a base station, a terminal, an access point (AP) of WiFi, a WiFi terminal or a relay station.

Finally, it should be noted that the above embodiments are only used to illustrate the technical solutions of the present application, which are not to be limited. Although the present application is described in detail in conjunction with the above embodiments, those skilled in the art should understand that modifications to the technical solutions of the embodiments can be made, or all or some technical features can be equivalently substituted, and the modifications or substitutions do not make the essence of the corresponding technical solutions depart from the scope of technical solutions of the embodiments of the present application.

What is claimed is:

1. A rate matching method for a polar code, comprising:
   determining, for a polar code outputted by an encoder, a plurality of candidate sets of puncturing locations, wherein puncturing locations indicated by any two sets of puncturing locations are not exactly the same;
   determining, for each of the sets of puncturing locations, a sum of error probabilities of all bit channels for transmitting information bits of the polar code, in a case that the set of puncturing locations is applied, wherein the sum of the error probabilities is an upper bound of a frame error rate corresponding to the set of puncturing locations; and
   selecting a set of puncturing locations with a minimum upper bound of the frame error rate, from the plurality of sets of puncturing locations, as a selected set of puncturing locations, and performing rate matching based on p puncturing locations indicated by the selected set of puncturing locations.

2. The method according to claim 1, wherein the determining a sum of error probabilities of all bit channels for transmitting information bits of the polar code, in a case that the set of puncturing locations is applied comprises:

initializing, for each of locations of code characters of the polar code, a mean value of log-likelihood ratios corresponding to the location of the code character, to obtain an initial value of the mean value of the log-likelihood ratios;

updating recursively the mean value of the log-likelihood ratios, based on the initial value of the mean value of the log-likelihood ratios;

obtaining an error probability of an i-th bit channel for transmitting the polar code, based on the updated mean value of the log-likelihood ratios, wherein the i is greater than or equal to 1 and is less than or equal to n, and the n is a code length of the Polar code; and adding up the error probabilities of all the bit channels, to obtain the sum of the error probabilities.

3. The method according to claim 2, wherein the updating recursively the mean value, E, of the log-likelihood ratios comprises:

$$E[L_n^{(2i-1)}] = \begin{cases} \phi^{-1}(1-(1-\phi(E[L_{n/2}^{(i)}(\text{up})])) \\ \quad (1-\phi(E[L_{n/2}^{(i)}(\text{up})])) & \text{none of them equals 0} \\ 0 & E[L_{n/2}^{(i)}(\text{up})] = 0 \\ 0 & E[L_{n/2}^{(i)}(\text{down})] = 0 \end{cases}$$

$$E[L_n^{(2i)}] = E[L_{n/2}^{(i)}(\text{up})] + E[L_{n/2}^{(i)}(\text{down})]$$

wherein the E indicates averaging.

4. The method according to claim 2, wherein the obtaining an error probability $p_i$ of an i-th bit channel for transmitting the polar code comprises:

$$p_i|_{PuncMode(j)} = Q(\sqrt{E[L_n^{(i)}]/2}), 1 \le i \le n$$

wherein the Q is a Q function, and j represents a j-th set of puncturing locations.

5. The method according to claim 1, wherein the performing rate matching based on p puncturing locations indicated by the selected set of puncturing locations comprises:

containing puncturing locations corresponding to a low code rate in puncturing locations corresponding to a high code rate.

6. The method according to claim 1, wherein the code length of the polar code is n, and the determining a plurality of candidate sets of puncturing locations comprises: randomly selecting the p puncturing locations indicated by each set of puncturing locations, from the n codes, wherein the p is less than the n.

7. A rate matching apparatus for a polar code, comprising a processor and a non-transitory computer-readable storage medium including computer-executable instructions executed by the processor to perform operations comprising:

determining, for a polar code outputted by an encoder, a plurality of candidate sets of puncturing locations, wherein puncturing locations indicated by any two sets of the puncturing locations are not exactly the same;

determining, for each of the sets of puncturing locations, a sum of error probabilities of all bit channels for transmitting information bits of the polar code, in a case that the set of puncturing locations is applied, wherein the sum of the error probabilities is an upper bound of a frame error rate corresponding to the set of puncturing locations;

selecting a set of puncturing locations with a minimum upper bound of the frame error rate, from the plurality of sets of puncturing locations, as a selected set of puncturing locations; and performing rate matching based on p puncturing locations indicated by the selected set of puncturing locations.

8. The apparatus according to claim 7, wherein the operations further comprise:

initializing, for each of locations of code characters of the polar code, a mean value of log-likelihood ratios corresponding to the location of the code character, to obtain an initial value of the mean value of the log-likelihood ratios;

updating recursively the mean value of the log-likelihood ratios, based on the initial value of the mean value of the log-likelihood ratios;

obtaining an error probability of an i-th bit channel for transmitting the polar code, based on the updated mean value of the log-likelihood ratios, wherein the i is greater than or equal to 1 and is less than or equal to n, and the n is a code length of the polar code; and obtaining the sum of the error probabilities of all the bit channels.

9. The apparatus according to claim 8, wherein the updating recursively the mean value of the log-likelihood ratios comprises:

$$E[L_n^{(2i-1)}] = \begin{cases} \phi^{-1}(1-(1-\phi(E[L_{n/2}^{(i)}(\text{up})])) \\ \quad (1-\phi(E[L_{n/2}^{(i)}(\text{up})])) & \text{none of them equals 0} \\ 0 & E[L_{n/2}^{(i)}(\text{up})] = 0 \\ 0 & E[L_{n/2}^{(i)}(\text{down})] = 0 \end{cases}$$

$$E[L_n^{(2i)}] = E[L_{n/2}^{(i)}(\text{up})] + E[L_{n/2}^{(i)}(\text{down})]$$

wherein the E indicates averaging.

10. The apparatus according to claim 8, wherein the obtaining the sum of the error probabilities of all the bit channels comprises:

$$p_i|_{PuncMode(j)} = Q(\sqrt{E[L_n^{(i)}]/2}), 1 \le i \le n,$$

wherein the $p_i$ is the error probability of the i-th bit channel for transmitting the polar code, Q is a Q function, and j represents a j-th set of puncturing locations.

11. The apparatus according to claim 7, wherein the performing the puncturing at the p puncturing locations indicated by the selected set of puncturing locations, comprises: containing puncturing locations corresponding to a low code rate in puncturing locations corresponding to a high code rate.

12. The apparatus according to claim 7, wherein the determining the plurality of candidate sets of puncturing locations, comprises: randomly selecting the p puncturing locations from n codes, wherein the p is less than the n and the n is a code length of the polar code.

13. A radio communication device, comprising: a processor coupled to a non-transitory computable-readable memory including instructions executed by the processor to perform operations comprising:

determining, for a polar code outputted by an encoder, a plurality of candidate sets of puncturing locations, wherein puncturing locations indicated by any two sets of the puncturing locations are not exactly the same;

determining, for each of the sets of puncturing locations, a sum of error probabilities of all bit channels for transmitting information bits of the polar code, in a case that the set of puncturing locations is applied, wherein the sum of the error probabilities is an upper bound of a frame error rate corresponding to the set of puncturing locations; and selecting a set of puncturing locations with a minimum upper bound of the frame error rate, from the plurality of sets of puncturing locations, as a selected set of puncturing locations; and performing rate matching based on p puncturing locations indicated by the selected set of puncturing locations.

* * * * *